US008416624B2

(12) United States Patent
Lei et al.

(10) Patent No.: US 8,416,624 B2
(45) Date of Patent: Apr. 9, 2013

(54) ERASE AND PROGRAMMING TECHNIQUES TO REDUCE THE WIDENING OF STATE DISTRIBUTIONS IN NON-VOLATILE MEMORIES

(75) Inventors: Bo Lei, San Ramon, CA (US); Guirong Liang, Santa Clara, CA (US); Anubhav Khandelwal, Mountain View, CA (US); Jun Wan, San Jose, CA (US)

(73) Assignee: SanDisk Technologies, Inc., Plano, TX (US)

( * ) Notice: Subject to any disclaimer, the term of this patent is extended or adjusted under 35 U.S.C. 154(b) by 201 days.

(21) Appl. No.: 13/072,387

(22) Filed: Mar. 25, 2011

(65) Prior Publication Data

US 2011/0286279 A1  Nov. 24, 2011

Related U.S. Application Data

(60) Provisional application No. 61/347,299, filed on May 21, 2010.

(51) Int. Cl.
G11C 16/04 (2006.01)

(52) U.S. Cl.
USPC ............ 365/185.19; 365/185.29; 365/185.17; 365/185.18

(58) Field of Classification Search ............. 365/185.19, 365/185.29, 185.17, 185.18
See application file for complete search history.

(56) References Cited

U.S. PATENT DOCUMENTS

| | | | |
|---|---|---|---|
| 4,630,086 A | 12/1986 | Sato et al. | |
| 5,172,338 A | 12/1992 | Mehrotra et al. | |
| 5,177,706 A | 1/1993 | Shinohara et al. | |
| 5,258,958 A | 11/1993 | Iwahashi et al. | |
| 5,404,485 A | 4/1995 | Ban | |
| 5,412,601 A | 5/1995 | Sawada et al. | |
| 5,418,752 A | 5/1995 | Harari et al. | |
| 5,457,658 A | 10/1995 | Niijima et al. | |
| 5,469,444 A | 11/1995 | Endoh et al. | |
| 5,471,478 A | 11/1995 | Mangan et al. | |
| 5,521,865 A | 5/1996 | Ohuchi et al. | |
| 5,539,690 A | 7/1996 | Talreja et al. | |

(Continued)

FOREIGN PATENT DOCUMENTS

EP  0 548 564 A2  11/1992
EP  0 673 037      9/1995

(Continued)

OTHER PUBLICATIONS

Communication Relating to the Results of the Partial International Search for International Application No. PCT/US2011/035190 dated Oct. 19, 2011, 16 pages.

(Continued)

*Primary Examiner* — Tuan T. Nguyen

(74) *Attorney, Agent, or Firm* — Davis Wright Tremaine LLP

(57) ABSTRACT

Techniques are presented for use in memory devices to improve reliability and endurance by reducing the widening in state distributions, that occurs after multiple write/erase cycles. One set of techniques uses a pre-conditioning operation where a pulse series, which may include program and gentle erase, are applied to one or more wordlines while a voltage differential is applied in the wordline direction, bit-line direction, or both. Another set of techniques uses a dual or multi-pulse program process, where an increased wordline-to-wordline differential used in the first pulse of a pair.

40 Claims, 7 Drawing Sheets

U.S. PATENT DOCUMENTS

| | | | |
|---|---|---|---|
| 5,570,315 | A | 10/1996 | Tanaka et al. |
| 5,602,789 | A | 2/1997 | Endoh et al. |
| 5,603,001 | A | 2/1997 | Sukegawa et al. |
| 5,623,444 | A * | 4/1997 | Gotou et al. ............ 365/185.23 |
| 5,652,719 | A | 7/1997 | Tanaka et al. |
| 5,712,180 | A | 1/1998 | Guterman et al. |
| 5,717,632 | A | 2/1998 | Richart et al. |
| 5,724,284 | A | 3/1998 | Bill et al. |
| 5,740,112 | A | 4/1998 | Tanaka et al. |
| 5,768,192 | A | 6/1998 | Eitan |
| 5,787,484 | A | 7/1998 | Norman |
| 5,812,458 | A * | 9/1998 | Gotou ............ 365/185.23 |
| 5,870,334 | A | 2/1999 | Hemink et al. |
| 5,890,192 | A | 3/1999 | Lee et al. |
| 5,892,706 | A | 4/1999 | Shimizu et al. |
| 5,949,714 | A | 9/1999 | Hemink et al. |
| 5,969,985 | A | 10/1999 | Tanaka et al. |
| 6,044,013 | A | 3/2000 | Tanaka et al. |
| 6,044,019 | A | 3/2000 | Cernea et al. |
| 6,069,821 | A | 5/2000 | Jun et al. |
| 6,088,559 | A | 7/2000 | Costanza et al. |
| 6,103,573 | A | 8/2000 | Harari et al. |
| 6,134,140 | A | 10/2000 | Tanaka et al. |
| 6,134,141 | A | 10/2000 | Wong |
| 6,148,262 | A | 11/2000 | Fry |
| 6,181,599 | B1 | 1/2001 | Gongwer |
| 6,188,615 | B1 | 2/2001 | Perner et al. |
| 6,208,560 | B1 | 3/2001 | Tanaka et al. |
| 6,222,762 | B1 | 4/2001 | Guterman et al. |
| 6,246,933 | B1 | 6/2001 | Bague |
| 6,259,627 | B1 | 7/2001 | Wong |
| 6,266,270 | B1 | 7/2001 | Nobukata |
| 6,282,117 | B1 | 8/2001 | Tanaka et al. |
| 6,363,010 | B2 | 3/2002 | Tanaka et al. |
| 6,373,746 | B1 | 4/2002 | Takeuchi et al. |
| 6,434,055 | B2 | 8/2002 | Tanaka et al. |
| 6,438,027 | B1 | 8/2002 | Kwon |
| 6,462,986 | B1 | 10/2002 | Khan |
| 6,462,988 | B1 | 10/2002 | Harari |
| 6,483,744 | B2 | 11/2002 | Kim et al. |
| 6,545,909 | B2 | 4/2003 | Tanaka et al. |
| 6,549,464 | B2 | 4/2003 | Tanaka et al. |
| 6,556,475 | B2 | 4/2003 | Yamazaki et al. |
| 6,621,739 | B2 | 9/2003 | Gonzalez et al. |
| 6,785,164 | B2 | 8/2004 | Gonzalez et al. |
| 6,798,698 | B2 | 9/2004 | Tanaka et al. |
| 6,839,281 | B2 | 1/2005 | Chen et al. |
| 6,850,441 | B2 | 2/2005 | Mokhlesi et al. |
| 6,952,365 | B2 | 10/2005 | Gonzalez et al. |
| 6,958,936 | B2 | 10/2005 | Quader et al. |
| 7,092,295 | B2 | 8/2006 | Iwase et al. |
| 7,106,626 | B2 | 9/2006 | Goldman et al. |
| 7,177,195 | B2 | 2/2007 | Gonzalez et al. |
| 7,298,647 | B2 | 11/2007 | Li et al. |
| 7,420,846 | B2 | 9/2008 | Chen et al. |
| 7,460,406 | B2 | 12/2008 | Mokhlesi et al. |
| 7,633,807 | B2 * | 12/2009 | Chen et al. ............ 365/185.24 |
| 7,701,780 | B2 | 4/2010 | Mihnea et al. |
| 7,848,149 | B2 | 12/2010 | Gonzalez et al. |
| 2001/0028576 | A1 | 10/2001 | Miwa et al. |
| 2002/0101778 | A1 | 8/2002 | Khan |
| 2002/0118574 | A1 | 8/2002 | Gongwer et al. |
| 2002/0196661 | A1 | 12/2002 | Banks |
| 2004/0252567 | A1 | 12/2004 | Kato |
| 2004/0264253 | A1 | 12/2004 | Hirano |
| 2005/0013169 | A1 | 1/2005 | Tanaka et al. |
| 2005/0185470 | A1 | 8/2005 | Suzuki et al. |
| 2006/0221696 | A1 | 10/2006 | Li |
| 2006/0233010 | A1 | 10/2006 | Li |
| 2006/0233021 | A1 | 10/2006 | Lin et al. |
| 2006/0233023 | A1 | 10/2006 | Lin et al. |
| 2006/0239080 | A1 | 10/2006 | Li |
| 2006/0291285 | A1 | 12/2006 | Mokhlesi |
| 2007/0002626 | A1 | 1/2007 | Li |
| 2007/0058435 | A1 | 3/2007 | Chen |
| 2007/0171744 | A1 | 7/2007 | Mokhlesi et al. |
| 2009/0059660 | A1 | 3/2009 | Lee et al. |
| 2010/0172180 | A1 | 7/2010 | Paley et al. |
| 2010/0214850 | A1 * | 8/2010 | Hosono .................... 365/185.22 |
| 2010/0238729 | A1 * | 9/2010 | Lee et al. ................. 365/185.11 |
| 2011/0032757 | A1 | 2/2011 | Dutta et al. |
| 2011/0267886 | A1 * | 11/2011 | Tanaka et al. ............ 365/185.11 |

FOREIGN PATENT DOCUMENTS

| | | | |
|---|---|---|---|
| EP | 1 096 501 A1 | | 5/2001 |
| JP | 2001-504973 | | 4/2001 |
| JP | 2001-184857 | | 7/2001 |
| JP | 2001-274355 | | 10/2001 |
| WO | WO 99/44113 | | 9/1999 |
| WO | WO 01/61703 | | 8/2001 |
| WO | 2004053882 | A1 | 6/2004 |
| WO | 2004114316 | A2 | 12/2004 |
| WO | WO 2007/076451 | | 7/2007 |

OTHER PUBLICATIONS

Communication Relating to the Results of the Partial International Search for International Application No. PCT/US2011/035190 dated Aug. 2, 2011, 2 pages.

Nobukata et al., "A 144Mb 8-Level NAND Flash Memory with Optimized Pulse Width Programming," *1999 Symposium on VLSI Circuits Digest of Technical Papers*, pp. 39-40.

Johnson et al., "THPM 12.6: A 6Kb Electrically Erasable Nonvolatile Memory," *International Solid State Circuits Conference*, Feb. 14, 1980, pp. 152-153, 271.

Ohkawa et al., "A 98mm$^2$ 3.3V 64Mb Flash Memory with FN-NOR Type 4-Level Cell," *IEEE International Solid State Circuits Conference*, Session 2, Flash Memory, Paper TP 2.3, 1996, 36-37.

Pohm, et al, "The Design of a One Megabit Non-Volatile M-R Memory Chip Using 1.5*5 mu m Cells," *IEEE Transactions on Magnetics*, vol. 24, No. 6, Nov. 1988, pp. 3117-3119.

U.S. Appl. No. 12/833,167, filed Jul. 9, 2010, 55 pages.
U.S. Appl. No. 12/757,300, filed Apr. 9, 2010, 38 pages.
U.S. Appl. No. 12/642,584, filed Dec. 18, 2009, 76 pages.

* cited by examiner

ERASE AND PROGRAMMING TECHNIQUES TO REDUCE THE WIDENING OF STATE DISTRIBUTIONS IN NON-VOLATILE MEMORIES

CROSS-REFERENCE TO RELATED APPLICATION

This application claims priority to and receives the benefit of U.S. Provisional Application No. 61/347,299 filed May 21, 2010, which application is incorporated herein in its entirety by this reference.

FIELD OF THE INVENTION

This invention relates generally to the erasing and programming of non-volatile memories and, more specifically, to techniques for reducing the widening in state distributions that can arise from, for example, charge traps between memory cells

BACKGROUND

In non-volatile memory systems, such as flash EEPROM devices, the accurate storage of data is dependent upon the data being both written and read back with accuracy. The accurate programming of data relies upon the individual memory cells being written into well-defined distributions of threshold voltage values for each of the data states that the memory cells may store. This is particularly true of multistate devices, with the situation becoming ever more critical as device sizes shrink and the voltage window allotted for an increasing number of states becomes smaller. Consequently there is an ongoing need to improve techniques for providing a tighter distribution of states during write operations.

SUMMARY OF THE INVENTION

According to a first set of aspects, a method of operating a non-volatile memory array is presented. The array includes one or more erase blocks, each having a plurality on memory cells formed along bitlines and wordlines. The method includes performing an erase operation on the memory cells of one or more selected erase blocks, where the erase operation includes performing a stress phase and an erase phase. The stress phase includes applying a pattern of voltage levels to the bitlines corresponding to the selected erase blocks, where the pattern includes a voltage differential between at least one pair of adjacent ones of the corresponding bit lines, and, while applying the pattern of voltage levels to the bitlines, applying a pulse of positive voltage to one or more of the wordlines corresponding to the selected erase blocks. The erase phase includes biasing the selected erase blocks to induce erasure of the memory cells of the selected erase block.

According to another set of aspects, a method of operating a non-volatile memory array is presented. The array includes one or more erase blocks each having a plurality of memory cells formed along bitlines and wordlines and is of a NAND type of architecture where a plurality of memory cells are connected in series between first and second select gates. The method includes performing an erase operation on the memory cells of one or more selected erase blocks, where the erase operation includes a stress phase and an erase phase. As part of the stress phase, a first high voltage pulse is applied to a first subset of one or more non-adjacent ones of the wordlines corresponding to the selected erase blocks, the first subset including at least one wordline corresponding to memory cells not adjacent to a select gate, and, while applying the high voltage pulse to the first subset of wordlines, the others of the wordlines corresponding to the selected erase blocks are set to a low voltage level. The erase phase includes biasing the selected erase blocks to induce erasure of the memory cells of the selected erase block.

In yet further aspects, a method of writing data to a non-volatile memory is presented. The method includes performing an alternating series of program and verify phases on a selected plurality of memory cells formed along a selected wordline. The verify phase includes performing a verify operation that individually locks out from further programming selected memory cells in response to successfully verifying as programmed to a corresponding target state. The programming phase includes applying a first and a second programming pulse to the selected wordline without an intervening verify operation, wherein a non-selected wordline adjacent to the selected wordline is set to a first voltage during the first programming pulse and to a second voltage during the second voltage during the second programming pulse, wherein the first and second voltages are distinct positive voltages.

Various aspects, advantages, features and embodiments of the present invention are included in the following description of exemplary examples thereof, whose description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

The techniques presented below can be used to improve the reliability and endurance of non-volatile memories by reducing the effects of charge traps between memory cells as a non-volatile memory is cycled over many erase/program cycles. Under the prior art, one way to lessen such degradation effects is to optimize processing during manufacturing, but this is not always scalable for technology generations as devices continue to shrink in size. Another way to treat this problem is reducing the programming step-size to accommodate the wider distributions; however, this slows programming speeds, introducing an often unacceptable performance penalty. The techniques presented here apply include a stress or conditioning phase with the erase process in order to reduce amount of charge traps between memory cells, especially for cycled cells. In the following this is often referred to as pre-stress/pre-conditioning as, in many embodiments, it occurs before the actually erase phase of the larger erase operation and, in all the embodiments, before the writing of data in the erased cells. For example, in a first set of exemplary embodiments, pre-stress/pre-conditioning is the application of a set of voltage stresses placed on different word lines before the erase and actual data programming (or after erase and before program). Further embodiments, presented below under the corresponding heading, use a double-pulse programming method that incorporates a stress phase into the programming operation.

Noise, from trapped electrons as well as other sources, can affect the accuracy of both read and write operation. Noise in the context of sensing operations, both for data reads and program verify, are considered in U.S. Pat. Nos. 6,621,739 and 6,850,441, which also discuss various aspects of memory devices in general and NAND-type devices in particular. U.S. Pat. No. 6,850,441 and references cited therein also provide some background discussion on the trapping of holes and electrons. The discussion presented here is concerned with the effect of noise on the write operation, particularly after a memory device has undergone a number of program/erase cycles. The use of pre-conditioning reduces program noise, especially for highly cycled cells, without degrading the program performance.

Figure 1:
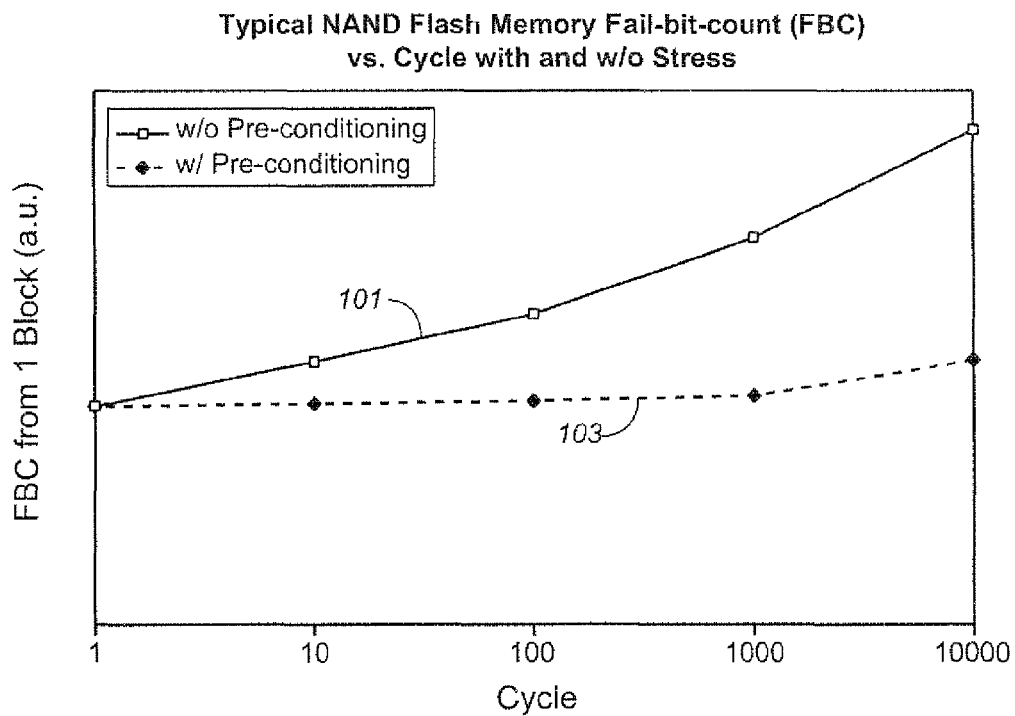
FIG. 1 shows how pre-conditioning can improve memory endurance.

The pre-stress/preconditioning schemes presented here can be incorporated into the erase operation of a memory system in a number of ways. (See below for example, such as described with respect to FIGS. 5A and 5B). Generally speaking, in addition to an erase phase in which the selected memory cells are erased in a more or less typical manner, the erase operations also incorporates a stress phase. FIG. 1 illustrates how such pre-conditioning can improve endurance and reliability by lowering the fail bits count. As shown in the upper trace 101 of FIG. 1, the number of failed bits (the failed bit count, or FBC, on the vertical axis) begins to grow significantly as the number of program-erase cycles (horizontal axis) increases. By incorporating pre-conditioning, the number of failed bits is noticeably flatter as a function of the number of cycles, as shown at 103.

In many respects, this is similar to some prior art arrangements for erase processes where, prior to erase the memory cells are programmed somewhat. Such an approach is described, for example, in U.S. Pat. No. 7,420,846. In those cases, however, the goal is more to even out wear among the memory cells by bringing up the cells programmed at lower state to a higher level, so that they all have a similar programming history. This also provides a more uniform starting point for the following erase process, leading to a more uniform post-erase/pre-program starting point for the cells of a block prior to any data write. In that sense, this is a complementary process to what is being presented here, where a relatively high wordline-to-wordline voltages are used in the conditioning process in order to reduce programming noise. Consequently the two sorts of pre-erase programming operations can be used together or separately.

Another prior art arrangement is described in U.S. patent publication US 20080298123 A1 (or U.S. Pat. No. 7,701, 780), that presents a "healing" process that can be used as a preconditioning operation, but which is again a complementary process to what is described here. The "healing" process described there is largely concerned with the edge wordlines in a NAND architecture that are the first and last wordlines placed next to either the source side or drain side select gates of a NAND string. In that process, the select gate is taken to ground, while the adjacent wordline is taken high, in order to "heal" the area of the NAND string in between. For the non-edge wordlines, these are also taken high in order to have little or no intra-wordline differences, specifically in order to eliminate, or at least minimize the lateral field differences between wordlines. In contrast, the techniques presented here enhance the pre-condition or stress operation by biasing the neighboring wordlines of wordlines selected for pre-conditioning to different voltages. (Also, although the pre-conditioning technique presented here is mainly described in the context of a NAND device, it is not so limited, whereas the "healing" technique of US patent publication US 20080298123 A1 is specifically directed at wordlines adjacent to the select gates as found at the ends of NAND strings.)

With respect to the voltage difference between a wordline selected for pre-conditioning (whether a single wordline or as part of the sorts of patterns of wordlines described below) and a neighboring wordline, generally speaking the greater the difference the greater the effect will be; however, the larger differences lead to more stress on the device. Consequently, the specific values used will be a design choice to compromise between these two concerns. In any ease, a relatively large difference is applied between a wordline selected for pre-conditioning and at least one neighboring wordline, as opposed to the "healing" technique of US patent publication US 20080298123 which seeks to keep wordline-to-wordline voltage differences small or zero. In the various embodiments below, the low values applied to a neighboring wordline may not taken to ground, but to a relatively low value, since having the transistors on the neighboring wordline somewhat conductive can also be useful. This can be one of the various read or pass levels already available on the device or a specific level for this process. For a single wordline type of embodiment, the neighboring wordlines could be taken to something like 8V and in the even/odd arrangements discussed further down this could be on the order of 3-4V. Similar considerations apply to select gates adjacent to a wordline, whether at the end of a NAND string or an adjoining select gate in other architectures; for example, in a NAND string a typical pass voltage for read operations could be used. (Again in contrast to prior art "healing" method discussed above, having the select can somewhat on, as opposed to setting its control gate at ground, can be beneficial to the process.)

Although more widely applicable to other non-volatile devices, the various aspects described in the following will be presented in the context of a EEPROM based flash memory of a NAND type architecture. More detail on such exemplary embodiments can be found in, for example: U.S. patent application Ser. No. 12/833,167; US patent publications numbers US 2006-0233023-A1; US 2006-0233021-A1; US 2006-0221696-A1; US 2006-0233010-A1; US 2006-0239080-A1; and US 2007-0002626-A1; and U.S. Pat. Nos. 6,958,936; 7,298,647; and 6,839,281, which incorporated references provide further discussion of the larger structure and operation of such devices.

Incorporation of Stress Phase into Erase Operations

Figure 2A:
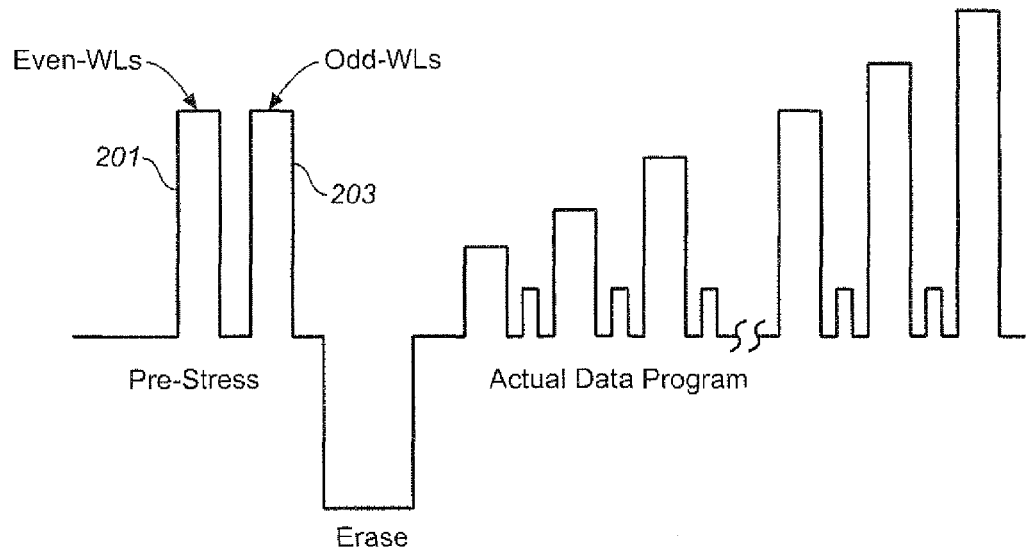
FIGS. 2A is an exemplary composite waveform for a double-pulse pre-conditioning.

A first set of exemplary embodiments uses a double pulse pre-conditioning/pre-stress operation, where the two consecutive pulses being applied on alternate wordlines. This can be illustrated with respect to FIGS. 2A-2C. FIG. 2A schematically illustrates the double-pulse pre-stress, where one pulse is applied on even wordlines and the other on odd wordlines. (In the figures, these pulses and the other waveforms are schematic, in that the duration of the erase pulse, for example, may be relatively longer than shown.) The erase portion and actual data program portion can be taken as typical operations in the prior art cited above; however, in addition to the erase phase, the erase operation now also includes the pre-stress phase.

As shown in FIG. 2A, in this example high voltage pulse 201 is first applied to the even wordlines, while the odd wordline are biased at a lower voltage, such as ~3-4V. Depending on the implementation, the voltage on the non-selected (here odd) wordline can be taken low enough so that none of the corresponding transistors are conducting, higher so that all of transistors are somewhat conducting regardless of their data state, or at an intermediate value. The roles of the even and odd wordlines are then reversed for the second pulse 203, after which the block is erased. (Here the erase phase is shown as a single pulse, although any of the standard erase operations can be used.) Once the block is erased, the various wordlines can be programmed with data.

Figure 2B:
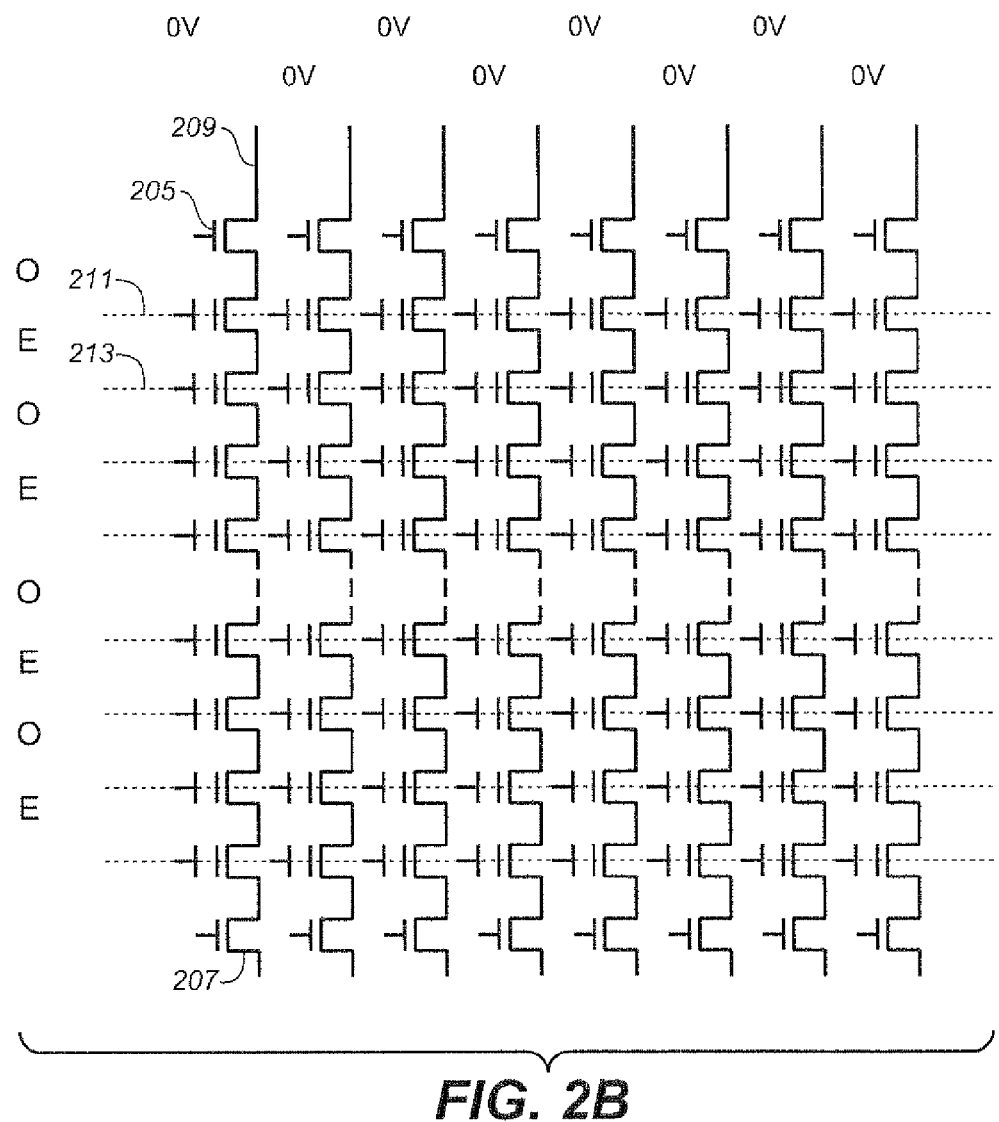
FIGS. 2B and 2C give an illustration of some exemplary bias values as applied to an array when using the waveform of FIG. 2A.
Figure 2C:
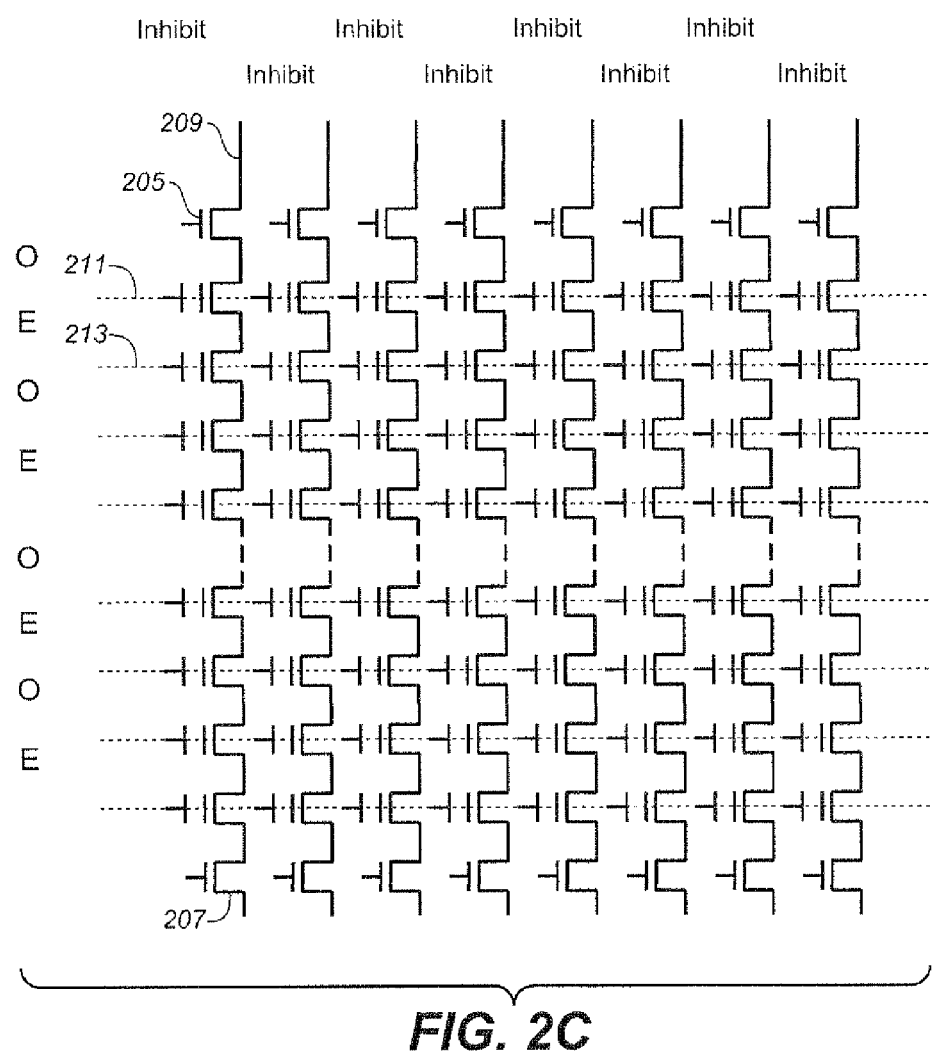

FIG. 2B illustrates the levels as applied for a block of a NAND array during the stress phase. Each of the NAND strings along the bitlines, such as 209, has a plurality of memory cells connected in series between a pair of select transistors, such as 205 and 207. The wordlines of the strings are alternately even and odd, respectively labeled 0 (as for 211) and E (as for 213). In the stress phase, a high voltage pulse is then applied to one set of the wordlines while the other set is set to the lower voltage, such as 3-4V. The roles are then reversed for the second stress pulse. The select transistors at either end of the NAND strings can be biased at a low voltage, such as ~2-3V. In the example of FIG. 2B, all of the bitlines are biased at 0V. Other embodiments and use different bitline levels. For example, the embodiment of FIG. 2C sets the bitlines above ground, here at the program inhibit voltages, typically the on-chip supply level VDD.

The even/odd arrangement applies this voltage difference to all of the wordline lines with just a pair of pulses during the pre-stress phase. This scheme can enhance the pre-conditioning field and significantly reduce the fail bits count. Besides from the odd/even arrangement, other wordline stress patterns can be used. Whether for a single pulse on a single wordline, the odd/even arrangement just described, or wordline stripe pattern, pre-conditioning data shows that the greater the voltage difference between neighboring wordlines magnifies the conditioning effect, although higher field levels place more stress on the device. Consequently, the specific values will be a design choice and devices of differing design, as well as devices of the same design due to process variations, may be optimized differently. The various values involved in the scheme (pulse duration, pulse voltage, neighboring wordline bias) can be parameter controlled and set by the manufacturer, for example at test time. They may also be varied to account device aging or error rate as controlled by the controller or a state machine on the memory chip.

Figure 3A:
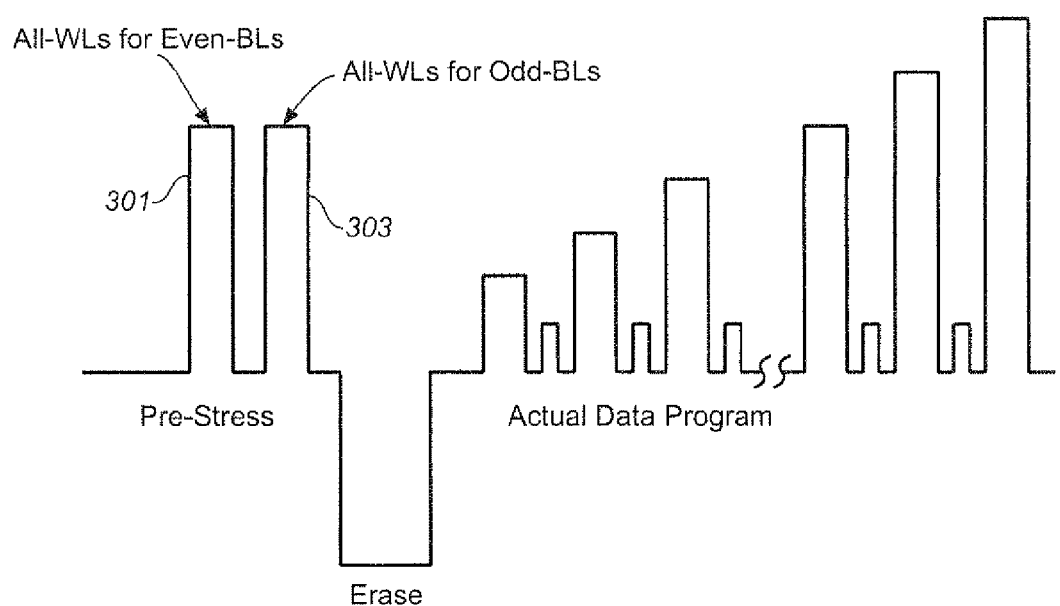
FIG. 3A illustrates a composite waveform that can be used in embodiments that apply a stress in the bitline direction.
Figure 3B:
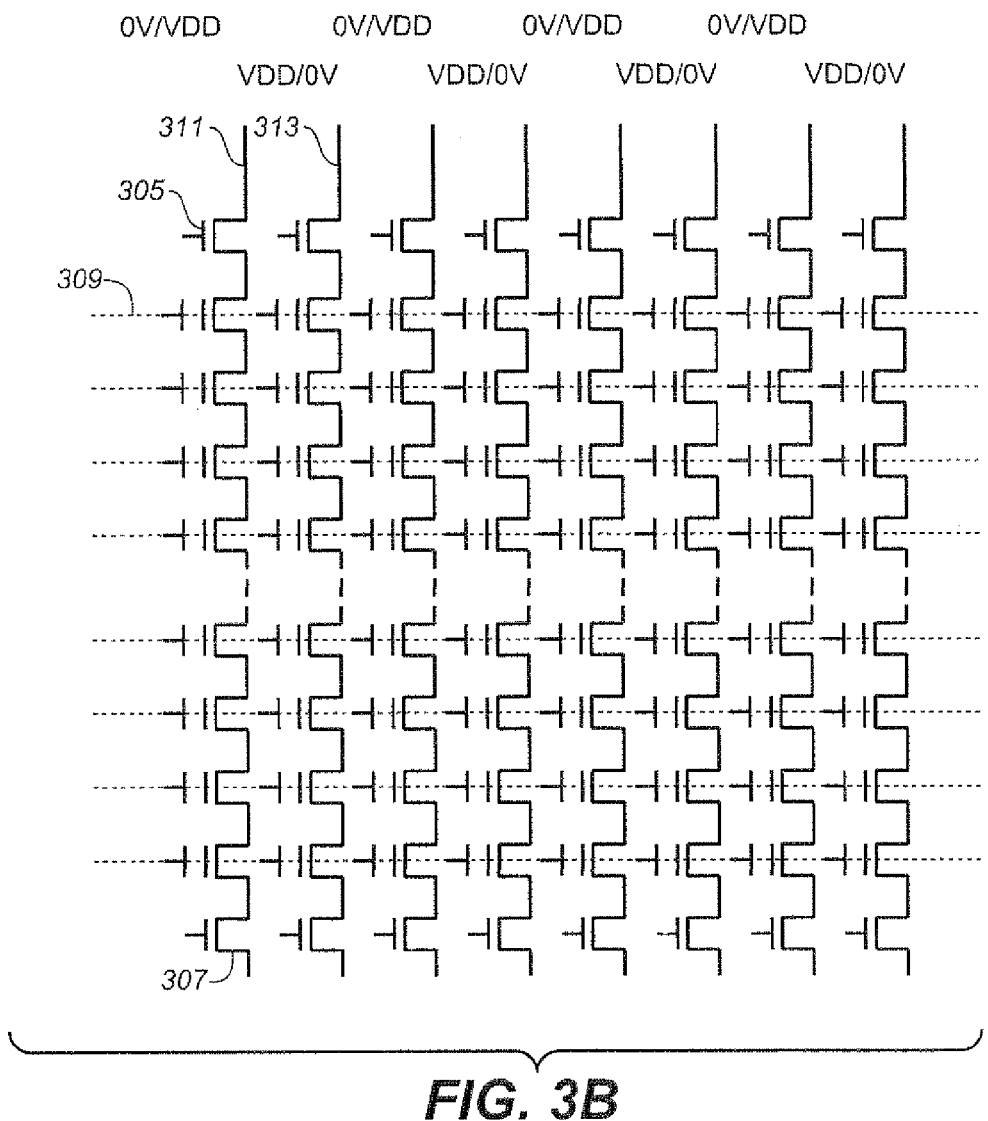
FIG. 3B is an illustration of some exemplary bias values as applied to an array when using the waveform of FIG. 3A.

Another set of exemplary embodiment for a double pulse pre-conditioning/pre-stress, but uses a differential even/odd biasing for the bitlines, as illustrated with respect to FIGS. 3A and 3B. FIG. 3A schematically illustrates a double-pulse pre-stress, similarly to FIG. 2A, but with the first pulse on all wordlines while odd bitlines at 0V and the even bitlines inhibited at a higher voltage (here VDD), and the second pulse again on all wordlines while the even bitlines at 0V and the odd bitlines inhibited (at the higher voltage, here VDD, although other values may be used). Note that although the waveform as presented here looks the same as in FIG. 2A, in FIG. 2A the first and second pulses are respectively applied to only even and odd wordlines (or vice versa), with the other wordlines low and the bitlines are at ground; where as in FIG. 3A both pulses are applied to all wordlines with the odd/even bitlines are high/low for one pulse and switched to low/high for the other. FIG. 3B correspondingly illustrates the array for this embodiment analogously to FIG. 2B for the previous odd/even wordline embodiment.

As shown in FIG. 3B, the bitlines of a selected erase block are alternately set to 0V and a higher voltage, such as VDD. The select transistors on either end of the selected NAND strings are turned on (e.g., at ~2-3V). A pulse is then applied to all of the wordlines. The biasing of the bit lines are then switched and a second pulse is applied to all of the wordlines.

As discussed above, the wordline-to-wordline pre-stress data shows that an increase voltage difference between neighboring wordlines magnifies the pre-stress effect. The same effect also applies to the bitline-to-bitline direction when the even bitlines are inhibited one of the all wordline pulses and the odd bitlines inhibited in the other pulse during pre-stress. Consequently this scheme can help reduce the program noise due to traps located between bitlines. As before, the various values involved in the scheme (pulse duration, pulse voltage, neighboring wordline bias, even/odd bit line biases) can again be parameter controlled. Also, although the embodiments described with respect to FIGS. 2A and 2B and those described with respect to FIGS. 3A and 3B have been presented separately, more generally they could be combined: for example, the could be performed consecutively as part as single pre-condition operation; they could both be used, but in different cycles; or a single pre-conditioning process could combine differential biases in both the wordline and bitline directions in each pulse.

Double-Pulse Programming

Figure 4:
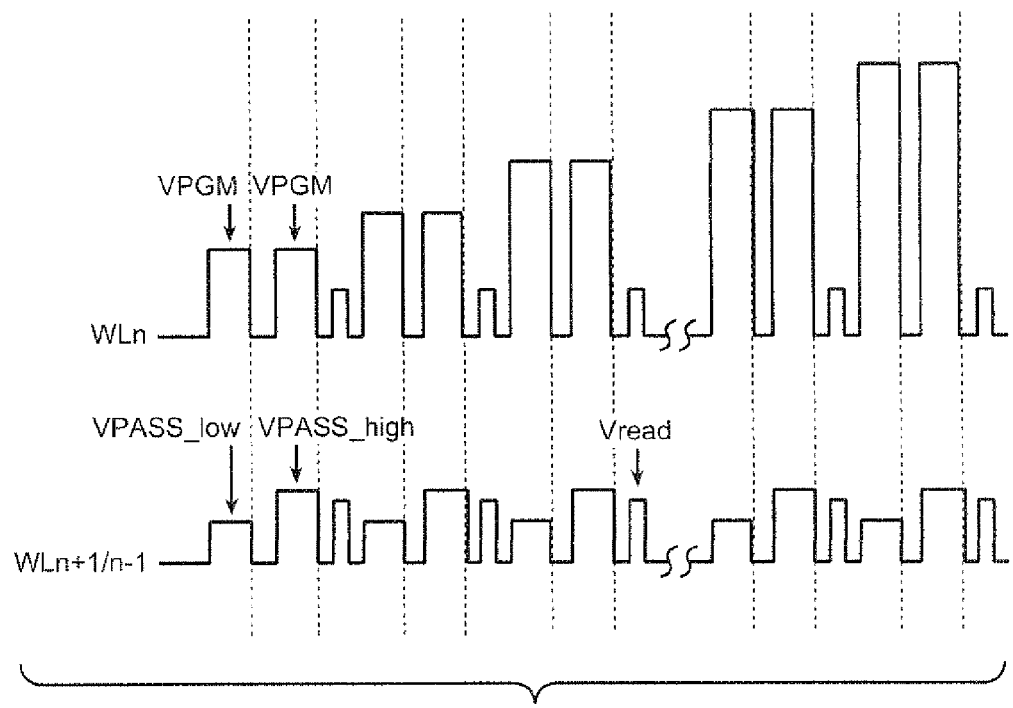
FIG. 4 shows an example of a programming waveform using double-pulse programming waveform during a write operation.

Another alternate embodiment to reduce distribution spreading by use of a "double-pulse" programming technique is illustrated with respect to FIG. 4. In this case, rather than use a distinct pre-conditioning phase to reduce noise, the noise reduction is incorporated in to the data write operation itself. This is illustrated in the double-pulse programming waveform illustrated by FIG. 4 for the programming of a selected wordline, here WLn. The waveform applied to the selected wordline WLn is shown at top and is a typically staircase waveform of alternating program phases (where VPGM is applied) and verify phases (where the Vread is applied), except that each pulse is applied twice. As cells verify, they can be individually locked out. The first pulse and second pulse in each program are at the same VPGM level without an intervening verify phase. The other bias levels (select gates, bit lines, non-selected wordlines) can be as normal, except that the neighboring wordlines of WLn+1 and WLn−1 now have the waveform as shown at the bottom of FIG. 4, in which the WLn+1 and WLn−1 wordlines are biased at VPASS_low in the first program pulse of WLn, and at the VPASS_high in the second program pulse of WLn. VPASS_high can be taken as the same value as for the other non-selected wordlines, such as ~8-9V, while the VPASS_low can be similar to the valued used for the non-selected wordlines in FIGS. 2B and 2C, such as ~2-4V.

The double-pulse program scheme may similarly be used to help to overcome the endurance issue, as the first pulse in each pair introduces a higher wordline-to-wordline differential. Similar to the discussion above for pre-conditioning, the device can use a much lower VPASS (VPASS_low) during the first pulse and then use a higher/normal VPASS (VPASS_high) in the second pulse. (Here, each step level is shown as a pair, although more general this need not be the case.) Much as pre-conditioning effects are enhanced by increasing the neighbor wordline bias difference, here there could be a similar gain by biasing at a lower VPASS (VPASS_low) during the first pulse programming. It should be noted that other programming techniques that use a "dual pulse" programming waveform, but under somewhat differing arrangements, are described in: U.S. patent application Ser. No. 12/536,127, filed Aug. 5, 2009; U.S. patent application Ser. No. 12/757,300, filed Apr. 9, 2010; and US patent publication number US2009/0059660. Although the techniques presented in these are complimentary to those being presented here, much of the discussion of the programming operations described can be applied here.

Variations and Generalizations

The preceding discussion has described a number of complimentary modes that can be used individually or in various combinations. For example, with respect to the double-pulse write technique, FIG. 4 shows each program phase to include a double pulse, but in other embodiments, only some program phase would include a double pulse, with other using the standard single pulse between verify operations. For example, as the lower lying states of a multi-level are often more susceptible to noise, the double pulse could only be used for the lower steps of the VPGM staircase. Alternately, the choice of single or double pulse could be based on performance requirements at the time of the write. For devices using both binary and multi-state storage (such as MLC memories using a binary cache as in US patent publication US-2010-0172180-A1 or U.S. patent application Ser. No. 12/642,584 filed on Dec. 18, 2009, for example), the binary portion could use a single pulse algorithm for higher performance, while the MLC section uses the dual pulse arrangement for improved accuracy.

The stress phase presented further above can be incorporate into the erase operation of a memory system in a number ways. For example, the conditioning phase can stress multiple wordlines to a high voltage before, after, or in between the pulses of an erase operation. For any of these arrangements, the conditioning phase can bias the non-selected wordlines at a lower voltage designed to enhance the conditioning field. In the embodiments described above, in those of FIGS. 2A-2C, all of the bitlines were selected with a pulse applied a pattern of wordlines; and in FIGS. 2A and 2B, all of the wordlines were pulsed while a pattern of voltages were applied to bitlines. More generally, a combination of these two could be used to apply various stress patterns. Consequently, for the seconditioning phases all bitlines are selected or only a fraction of the bitlines are selected at one time; similarly, when a pattern is applied to the bitlines, only a fraction of the wordlines need be pulsed.

As to the striping patterns used in the exemplary embodiments of FIGS. 2 and 3 respectively used every other wordline or bitline, allowing all of the wordlines/bitlines to be covered in a pair of pulses. More generally, other patterns can be used where one or more wordlines/bitlines are selected. For example, a lower number of wordlines (say, every third wordline) could be pulsed if there are current level or power considerations. These subsets can then be used in a rotating scheme in which less than all wordlines, bitlines, or both are selected and different groups of selected wordlines/bitlines are chosen on subsequent erase operations. Multiple conditioning operations (with or without an intervening erase phase), in which selected and unselected groups are alternated, can then be used so as that all wordlines and all bitlines are eventually conditioned.

For any of the variations, the duration and amplitude of the stress pulses can be optimized to balance effectiveness against device stress. Also, any variations can be used so that some wordlines are deliberately not conditioned, or conditioned at a different voltage, so as to avoid over-stress. Further, any of the above pre-conditioning modes can be inserted for every cycle before erase, or every certain numbers of cycles to improve device endurance, in a process that can be overseen by the controller, at the system level, by an on-chip state machine, or a combination of these. These variations can be further combined with cycle number (hot count) dependent schemes or by looking at the amount of read/write error, by, for example, increasing the stress voltage with write/erase cycling adaptively or implemented by a controller at the system level.

Figure 5A:
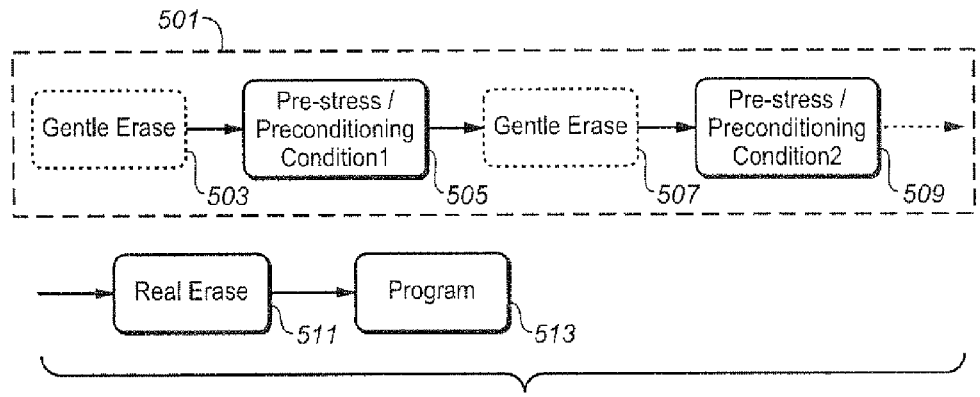
FIGS. 5A and 5B illustrates some exemplary sequences that use pre-conditioning during an erase operation, including an optional gentle erase.
Figure 5B:
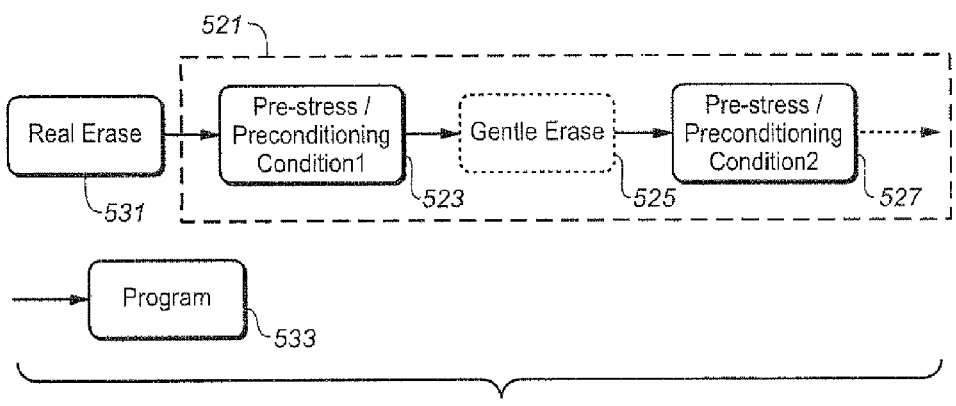

For example, FIGS. 5A and 5B are two examples of how the stress phase of the erase operation can be incorporated. In FIG. 5A, the erase operation includes both the real erase operation, or erase phase, 511 and the preconditioning phase of 501, after which the memory block can be programmed at 513 once selected. Here the preconditioning phase starts with a gentle erase operation 503, followed by a first stress sub-phase 505, subsequently followed by a second gentle erase 507, and then a second stress sub-phase 509. The gentle erase operations of 503 and 507 bias a selected erase block similarly to the "real erase" operation 511 (where the memory cells are fully erased), but will be of a lower amplitude, duration, or both. Such operations are sometimes referred to as "soft-erase". The pre-stress/pre-conditioning sub phases can both use the same set of bias conditions or differing conditions. For example, they could use differing amplitudes or the two pulses of FIG. 2A or 3A could be split so that one is at 505 and the other is at 507. The actual erase phase then follows at 511.

In FIG. 5B, the real erase phase 531 precedes the stress phase at 521, after which the block can be eventually programmed at 533 once selected. The stress phase 521 is similar to that at 501 in FIG. 5A, except that an initial soft erase is omitted as it now follows the stronger erase operation at 531. More specifically, the stress phase 521 here includes a first stress sub-phase 523, an intermediate gentle erase 525, and a second stress sub-phase at 527. As the last sub-operation of erase operation is the stress operation at 527, the parameters should be selected so as to not cause any significant programming of the memory cells. In addition to these various pre-stress/preconditioning operations that can be performed prior to the actual write of data, the "dual-pulse" programming operation for when data is written can also be combined with the erase operation including a stress phase.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated.

It is claimed:

1. A method of operating a non-volatile memory array comprising one or more erase blocks each having a plurality on memory cells formed along bitlines and wordlines, the method comprising:
   performing an erase operation on the memory cells of one or more selected erase blocks, the erase operation including:
      performing a stress phase, including:
         applying a pattern of voltage levels to the bitlines corresponding to the selected erase blocks, where the pattern includes a voltage differential between at least one pair of adjacent ones of the corresponding bit lines; and while applying the pattern of voltage levels to the bitlines, applying a pulse of positive voltage to one or more of the wordlines corresponding to the selected erase blocks; and performing an erase phase, including biasing the selected erase blocks to induce erasure of the memory cells thereof.

2. The method of claim 1, wherein the erase phase is performed after the stress phase in the erase operation.

3. The method of claim 1, wherein the stress phase is performed after the erase phase in the erase operation.

4. The method of claim 1, wherein said pulse is applied to all of the corresponding wordlines.

5. The method of claim 1, wherein the pattern of voltage levels includes applying a first positive voltage to a subset of one or more of the corresponding bitlines while the other ones of the corresponding bit lines are set at ground.

6. The method of claim 5, wherein the first positive voltage is the on-chip voltage supply level.

7. The method of claim 5, wherein the stress phase includes:

applying a first pulse to all of the corresponding wordlines while applying the first positive level a first subset of the corresponding bitlines and ground to the others of the corresponding bitlines; and applying a second pulse to all of the corresponding wordlines while applying the first positive level a second subset of the corresponding bitlines and ground to the others of the corresponding bitlines, where the first and second subsets differ.

8. The method of claim 7, wherein the first subset is ever alternate corresponding bitline and the second subset is those corresponding bitlines not in the first subset.

9. The method of claim 7, further comprising:

between applying the first and second pulses, performing a gentle erase operation wherein the selected erase blocks are biased using a lower voltage differential applied to the memory cells of the selected erase blocks than in the erase phase.

10. The method of claim 1, wherein the array is of a NAND type of architecture where the memory cells are arranged as strings of a plurality of memory cells connected in series between first and second select gates and wherein the pulse is applied to all of wordlines of a string of memory cells selected for a stress operation.

11. The method of claim 1, further comprising:

subsequent to perfuming the erase operation, performing a write operation on memory cells of the selected erase blocks.

12. The method of claim 11, further comprising:

subsequent to performing the write operation, performing a subsequent erase operation on at least erase block of the selected erase blocks, wherein the subsequent erase operation applies a different pattern of voltage levels to the bitlines than the erase operation performed prior to the write operation.

13. The method of claim 1, wherein the characteristics of the pulse are altered varied upon the number of write-erase cycles that the selected erase blocks have previously endured.

14. The method of claim 13, wherein said characteristics include the amplitude of the pulse.

15. The method of claim 1, wherein the inclusion of the stress phase in the erase operation is determined based the number of write-erase cycles that the selected erase blocks have previously endured.

16. The method of claim 15, wherein the stress phase is included more frequently in the erase operation as the number of write-erase cycles increases.

17. A method of operating a non-volatile memory array of one or more erase blocks each having a plurality of memory cells formed along bitlines and wordlines, where the array is of a NAND type of architecture where a plurality of memory cells are connected in series between first and second select gates, the method comprising:

performing an erase operation on the memory cells of one or more selected erase blocks, the erase operation including:

performing a stress phase, including applying a first high voltage pulse to a first subset of one or more non-adjacent ones of the wordlines corresponding to the selected erase blocks, the first subset including at least one wordline corresponding to memory cells not adjacent to a select gate; and while applying the high voltage pulse to the first subset of wordlines, setting the others of the wordlines corresponding to the selected erase blocks to a low voltage level; and performing an erase phase, including biasing the selected erase blocks to induce erasure of the memory cells thereof.

18. The method of claim 17, wherein the low voltage level is sufficiently low so that the memory cells along the others of wordlines are non-conducting.

19. The method of claim 17, wherein the low voltage level is sufficiently high so that the memory cells along the others of wordlines are conducting.

20. The method of claim 17, wherein the low voltage level is set such that the memory cells along the others of wordlines are partially conducting.

21. The method of claim 17, wherein one or more of the bitlines corresponding to the selected erase blocks are set at ground.

22. The method of claim 17, wherein one or more of the bitlines corresponding to the selected erase blocks are set at program inhibit voltage.

23. The method of claim 17, further comprising applying a voltage to control gates of select gates corresponding to the selected erase blocks so that they are in a conducting state.

24. The method of claim 17, wherein the erase phase is performed after the stress phase in the erase operation.

25. The method of claim 17, wherein the stress phase is performed after the erase phase in the erase operation.

26. The method of claim 17, wherein the stress phase further includes:

after applying the first high voltage pulse to the first subset, applying a second high voltage pulse to a second subset of one or more non-adjacent ones of the wordlines corresponding to the selected erase blocks, where the first and second subsets differ; and while applying the second high voltage pulse to the second subset of wordlines, setting the others of the wordlines not in the second subset to a low voltage level.

27. The method of claim 26, wherein the first subset is ever alternate corresponding wordline and the second subset is those corresponding wordlines not in the first subset.

28. The method of claim 26, further comprising:
between applying the first and second high voltage pulses, performing a gentle erase operation wherein the selected erase blocks are biased using a lower voltage differential applied to the memory cells of the selected erase blocks than in the erase phase.

29. The method of claim 17, further comprising:
subsequent to perfuming the erase operation, performing a write operation on memory cells of the selected erase blocks.

30. The method of claim 29, further comprising:
subsequent to performing the write operation, performing a subsequent erase operation on at least erase block of the selected erase blocks, wherein the subsequent erase operation uses a different first subset than the erase operation performed prior to the write operation.

31. The method of claim 17, wherein the characteristics of the high voltage pulse are altered varied upon the number of write-erase cycles that the selected erase blocks have previously endured.

32. The method of claim 31, wherein said characteristics include the amplitude of the high voltage pulse.

33. The method of claim 17, wherein the inclusion of the stress phase in the erase operation is determined based the number of write-erase cycles that the selected erase blocks have previously endured.

34. The method of claim 33, wherein the stress phase is included more frequently in the erase operation as the number of write-erase cycles increases.

35. A method of writing data to a non-volatile memory, comprising:
performing an alternating series of program and verify phases on a selected plurality of memory cells formed along a selected wordline,
wherein the verify phase includes performing a verify operation that individually locks out from further programming selected memory cells in response to successfully verifying as programmed to a corresponding target state, and
wherein the programming phase includes applying a first and a second programming pulse to the selected wordline without an intervening verify operation, wherein a non-selected wordline adjacent to the selected wordline is set to a first voltage during the first programming pulse and to a second voltage during the second voltage during the second programming pulse, wherein the first and second voltages are distinct positive voltages.

36. The method of claim 35, wherein the first voltage is lower than the second voltage.

37. The method of claim 35, wherein the non-volatile memory is of a NAND-type architecture.

38. The method of claim 37, wherein for a selected wordline that is not an edge wordline of the NAND structure, both non-selected wordlines adjacent to the selected wordline are set to the first voltage during the first programming pulse and to the second voltage during the second voltage during the second programming pulse.

39. The method of claim 37, wherein the first voltage is lower than the second voltage, and wherein non-adjacent non-selected wordlines of the NAND structure are set to the second voltage during the first and second programming pulses.

40. The method of claim 35, wherein the first and second programming pulses of each programming phase are of the same amplitude.

* * * * *

UNITED STATES PATENT AND TRADEMARK OFFICE
CERTIFICATE OF CORRECTION

PATENT NO. : 8,416,624 B2
APPLICATION NO. : 13/072387
DATED : April 9, 2013
INVENTOR(S) : Lei et al.

It is certified that error appears in the above-identified patent and that said Letters Patent is hereby corrected as shown below:

In the Claims

Column 10, line 2, please delete "based the" and insert -- based on the --.

Column 11, line 24, please delete "based the" and insert -- based on the --.

Signed and Sealed this
Twenty-fourth Day of December, 2013

Margaret A. Focarino
*Commissioner for Patents of the United States Patent and Trademark Office*